United States Patent [19]
Tanizaki

[11] Patent Number: 5,386,387
[45] Date of Patent: Jan. 31, 1995

[54] SEMICONDUCTOR MEMORY DEVICE INCLUDING ADDITIONAL MEMORY CELL BLOCK HAVING IRREGULAR MEMORY CELL ARRANGEMENT

[75] Inventor: Tetsushi Tanizaki, Hyogo, Japan

[73] Assignee: Mitsubishi Denki Kabushiki Kaisha, Tokyo, Japan

[21] Appl. No.: 111,818

[22] Filed: Aug. 25, 1993

[30] Foreign Application Priority Data

Aug. 28, 1992 [JP] Japan .................................. 4-230148

[51] Int. Cl.⁶ ........................ G11C 7/00; G11C 29/00
[52] U.S. Cl. ............................ 365/200; 365/230.03; 371/49.1
[58] Field of Search ................... 365/200, 201, 230.03; 371/49.1, 51.1

[56] References Cited
PUBLICATIONS
IBM Technical Disclosure Bulletin vol. 28 No. 7 Dec. 1985, pp. 2965–2970.

*Primary Examiner*—Eugene R. LaRoche
*Assistant Examiner*—F. Niranjan
*Attorney, Agent, or Firm*—Lowe, Price, LeBlanc & Becker

[57] ABSTRACT

In a semiconductor memory device according to the present invention, the relation between column selection lines and bit line pairs in each memory cell block is defined such that each normal memory cell block and an additional memory cell block share the same column decoder address. Therefore, in a semiconductor memory device having an irregular memory cell array arrangement, it is possible to replace a defective column in any of memory cell blocks by only one type of redundant column.

5 Claims, 6 Drawing Sheets

SEMICONDUCTOR MEMORY DEVICE INCLUDING ADDITIONAL MEMORY CELL BLOCK HAVING IRREGULAR MEMORY CELL ARRANGEMENT

BACKGROUND OF THE INVENTION

1. Field of the Invention

The present invention relates to a semiconductor memory device and particularly to a dynamic random access memory (DRAM) provided with an additional memory cell block having an irregular memory cell arrangement to hold parity bits.

2. Description of the Background Art

Conventionally, a semiconductor memory device such as a DRAM is configured such that, when a defective memory cell occurs, a column including the defective memory cell is detected and then the defective memory cell is remedied by substituting a spare redundant column provided separately for the column including the defective memory cell.

Figure 4:
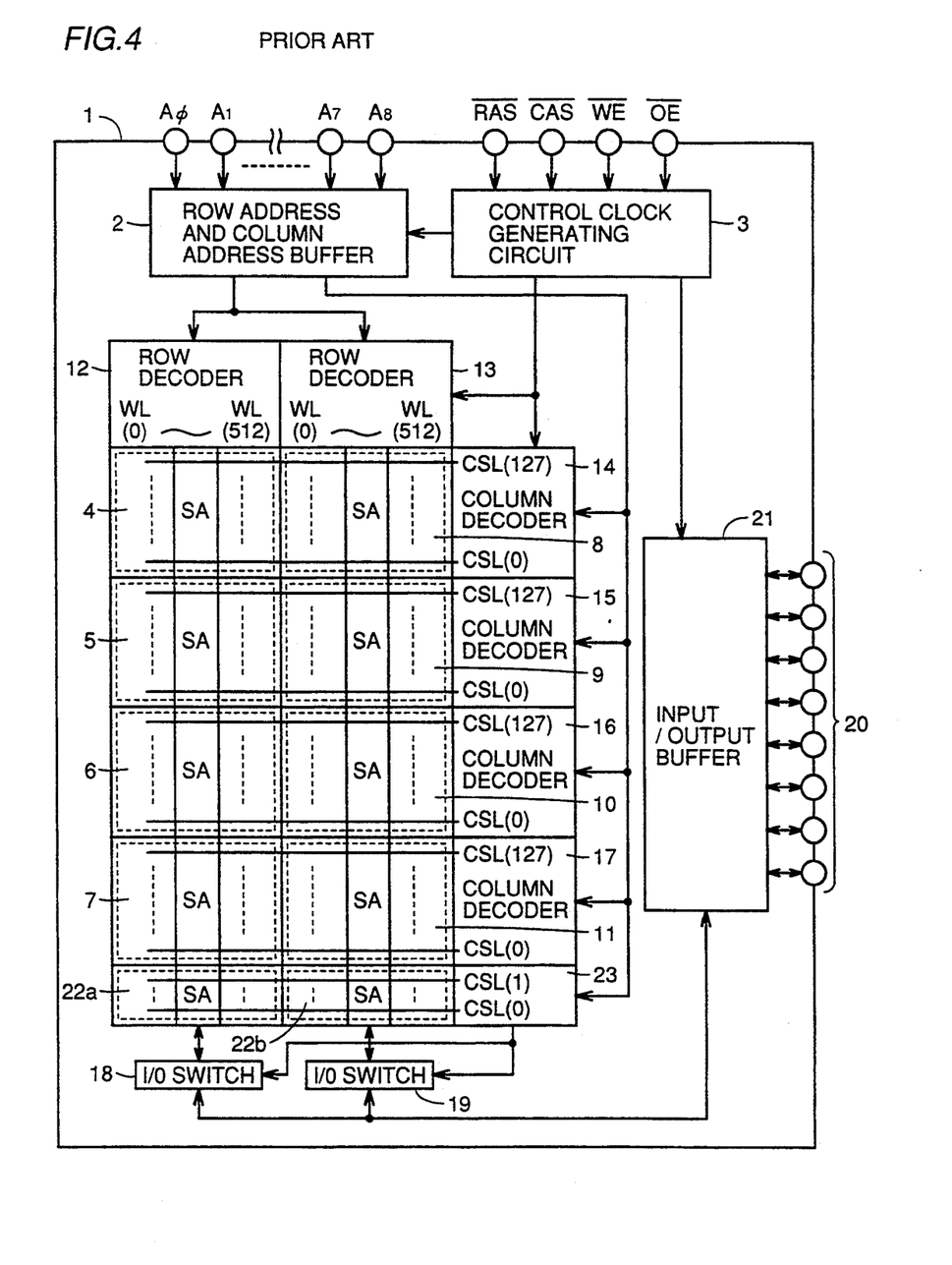
FIG. 4 is a schematic block diagram showing one example of a conventional DRAM.

FIG. 4 is a schematic block diagram showing an example of a DRAM provided with such redundant column. Referring to FIG. 4, row address and column address signals $A_0, A_1, ..., A_7, A_8$ are applied from an external address signal source (not shown) to a row address and column address buffer 2 on a chip 1, while a row address strobe signal ($\overline{RAS}$), a column address strobe signal ($\overline{CAS}$), a write enable signal ($\overline{WE}$) and an Output enable signal ($\overline{OE}$) are applied as various control signals from an external control signal source (not shown) to a control clock generating circuit 3 on chip 1.

A memory cell array divided into eight blocks 4-11 is provided on chip 1. Any of word lines WL0-WL512 passing through foursmemory cell blocks 4-7 on the left side of FIG. 4 is selected by a row decoder 12 based on a row address signal from aforementioned address buffer 2 and any of word lines WL0-WL512 passing through four memory cell blocks 8-11 on the right side is selected by a row decoder 13 based on the row address signal from address buffer 2.

Meanwhile, any of column selection lines CSL0-CSL127 passing through two uppermost memory cell blocks 4 and 8 in FIG. 4 is selected by a column decoder 14 based on a column address signal from the aforementioned address buffer 2, any of column selection lines CSL0-CSL127 passing through two memory cell blocks 5 and 9 in the second stage is selected by a column decoder 15 based on the column address signal from address buffer 2, any of column selection lines CSL0-CSL127 passing through two memory cell blocks 6 and 10 in the third stage is selected by a column decoder 16 based on the column address signal from address buffer 2, and any of column selection lines CSL0-CSL127 passing through two lowermost memory cell blocks 7 and 11 is selected by a column decoder 17 based on the column address signal from address buffer 2. The operation timing of aforementioned row decoders 12, 13 and column decoder 14-17 is controlled by clock signals generated from control clock generating circuit 3.

Data is written into and read out from a memory cell thus selected by a row address signal and a column address signal via an I/O switch 18 or 19, which will be described later. In the middle of each memory cell block a sense amplifier SA is provided to amplify the data read out from each memory cell.

Exchange of write/read data with the outside of the chip is carried out in parallel on a 8-bit basis through an input/output terminal 20 and an input/output buffer 21. The data transfer timing between the input/output buffer 1 and aforementioned I/O switches 18 and 19 and the data transfer timing between the input/output buffer 21 and input/output terminal 20 are controlled by clock signals generated from control clock generating circuit 3.

Here, in the DRAM of FIG. 4, memory cell blocks 22a and 22b for redundant columns are provided in addition to the aforementioned eight memory cell blocks. Any of word lines WL0-WL512 passing through the redundant memory cell block 22a on the left side is selected by row decoder 12 based on the row address signal, and any of word lines WL0-WL512 passing through the redundant memory cell block 22b on the right side is selected by row decoder 13 based on the row address signal. Either column selection line CSL0 or CSL1 passing through the redundant memory cell blocks 22a and 22b is selected by a redundant column decoder 23 based on the column address signal. The operations of redundant memory cell blocks 22a and 22b and redundant column decoder 23 will be described later in detail.

Figure 5:
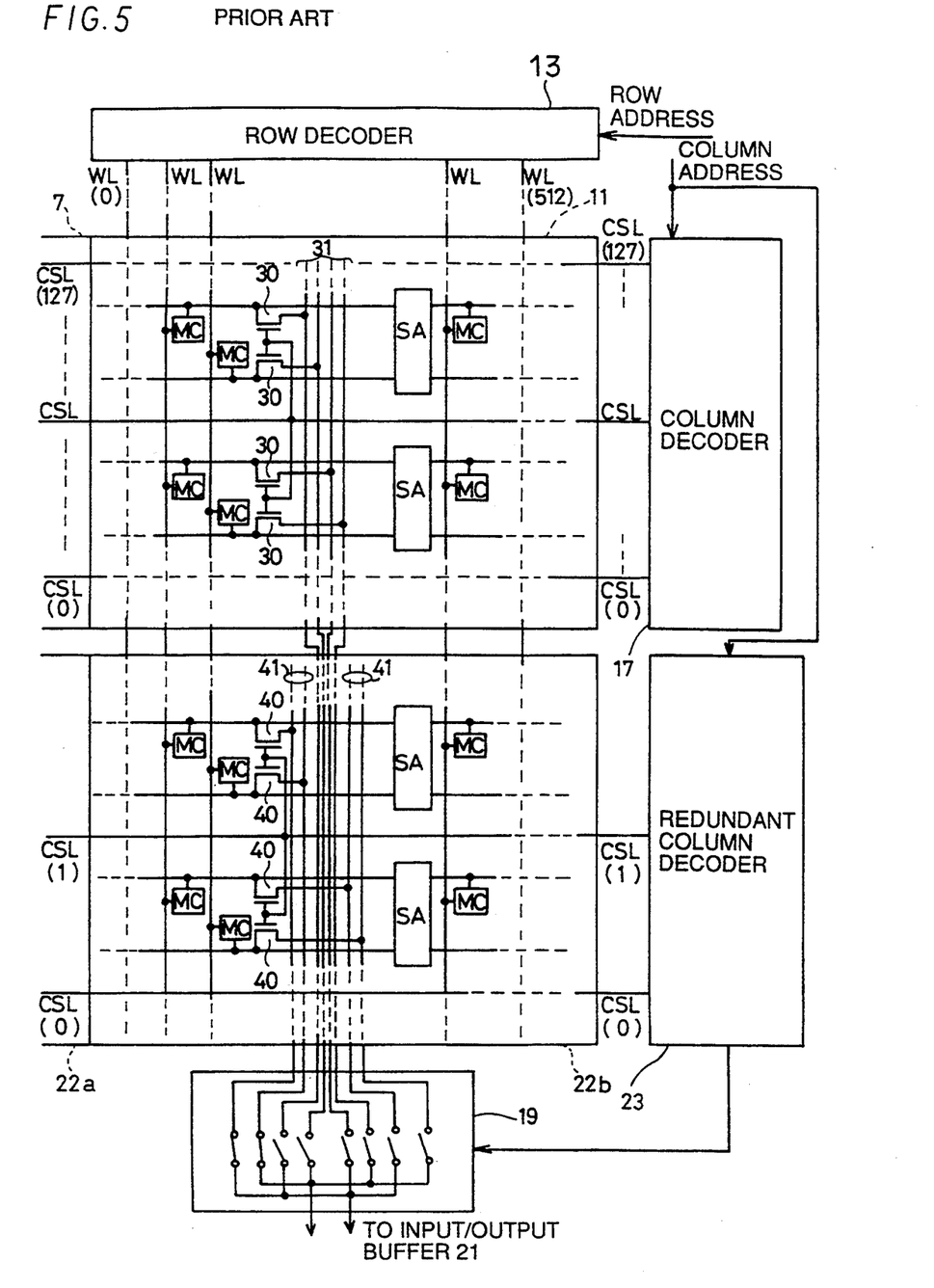
FIG. 5 is a circuit diagram showing in detail a main portion of the conventional DRAM shown in FIG. 4.

FIG. 5 is a circuit diagram showing a main portion of a DRAM in FIG. 4 in detail. FIG. 5 shows a main portion of two bit line pairs connected to a certain column selection line CSL extended from column decoder 17 among a plurality of bit line pairs which configure memory cell block 11 in FIG. 4 and elements associated therewith as well as a main portion of two bit line pairs connected to a certain column selection line CSL1 extended from redundant column decoder 23 among four bit line pairs which configure redundant memory cell block 22b in FIG. 4 and elements associated therewith. As shown in FIG. 5, two bit line pairs are connected to one column selection line CSL in a normal memory cell block 11, and also two bit line pairs are connected to one redundant column selection line CSL in redundant memory cell block 22b in the same manner.

In memory cell block 11, on writing and reading data, one column selection line CSL is selected by the corresponding column decoder, I/O gate transistors 30 of two bit line pairs connected to the column selection line are turned on and the two bit line pairs are connected to I/O lines 31. I/O lines 31 are connected to input/output buffer 21 (FIG. 4) through an I/O switch 19. Since the operation of writing and reading data in normal memory cell block is well known, more detail description will be omitted.

The operation of redundant memory cell block 22b and redundant column decoder 23 will be described. These memory cells for redundant column are provided, in case of occurrence of defect in a memory cell included in a normal memory cell block, to remedy the defective column including the defective memory cell. More specifically, each decoder is programmed such that when any defective memory cell has been detected in a normal memory cell block and its column address is designated by an external input, redundant column decoder 23 activates either one of two redundant column selection lines CSL0 and CSL1 in response, and replaces bit line pairs which correspond to the aforementioned defective column by two bit line pairs connected to the activated line. In redundant memory cell block 22b, I/O gate transistors 40 of two bit line pairs connected to the activated redundant column selection line CSL is turned on, and two bit line pairs are connected to I/O lines 41.

An I/O switch 19 is provided between I/O lines 31 and 41 from normal memory cell block 11 and from redundant memory cell block 22b and input/output buffer 21 (FIG. 4). When the redundant column decoder activates any of CSL lines to use a redundant column, this I/O switch 19 functions so that it selects I/O lines 41 according to a signal from redundant column decoder 23 and connects those lines to input/output buffer 21. Thus, the defective memory cell in the normal memory cell block is replaced by a redundant memory cell.

In the aforementioned example shown in FIG. 4, all the normal memory cell blocks as well as all the column decoders have the same structure (same column decoder address) one another, and therefore one type of the redundant column (i.e. redundant memory cell blocks 22a and 22b and redundant column decoder 23) could cope with (remedy) the defective memory cell occurred in any memory cell block.

Figure 6:
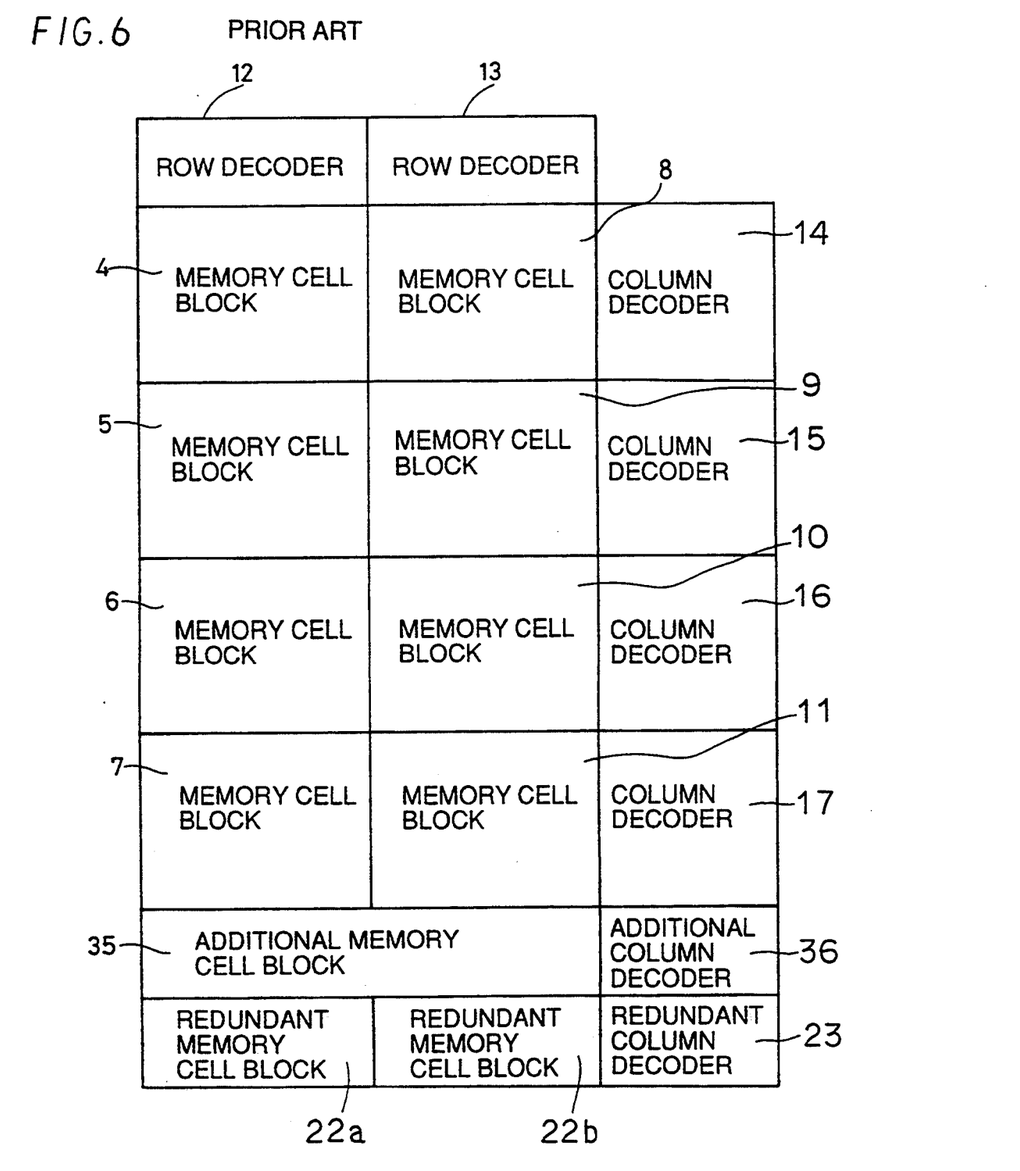
FIG. 6 is a schematic diagram showing an irregular memory cell array arrangement of the conventional DRAM.

Meanwhile, generally in a DRAM, (for example 8-bit) data read/written sometimes accompanies a known (for example 1-bit) parity bit for error correction. When accompanies the parity bit, further memory cell block for parity bits must be added to the memory cell array arrangement in FIG. 4. FIG. 6 is a diagram schematically showing a configuration of a DRAM having an additional memory cell block for parity bits like this and an additional column decoder therefor.

In FIG. 6, DRAM memory cell array arrangement has an additional memory cell block 35 for the parity bits and additional column decoder 36 in addition to the configuration of FIG. 4, and additional memory cell block 35 has a rectangular structure (memory cell arrangement) which is different from each of normal memory cell blocks 4–11 from the viewpoint of layout of the entire memory cell array.

Since all of aforementioned normal memory cell blocks 4–11 have the same configuration (memory cell arrangement) and therefore share the same column decoder address, one type of a redundant column (redundant memory cell blocks 22a and 22b and redundant column decoder 23) could cope with the occurrence of defective memory cell in any memory cell block, but when memory cell block 35 which has a different configuration as shown in FIG. 6 is added, conventional one type of redundant column cannot cope with (remedy) the defective column in the additional memory cell block 35.

Here, it is necessary for each type of memory cell blocks to provide its own redundant column for the memory cell array including two types of memory cell blocks as shown in FIG. 6 to remedy the defective memory cell array, but in such case the area of chip 1 itself increases.

SUMMARY OF THE INVENTION

One object of the present invention is to provide a semiconductor memory device which can remedy a defective memory cell without increasing a chip area in an irregular memory cell array arrangement including multiple types of memory cell blocks which have different structures.

Another object is to provide a semiconductor memory device which can also remedy a defective memory cell both in a normal memory cell block and in an additional memory cell block by one type of a redundant column, in a memory cell array arrangement including an additional memory cell block for the parity bits.

A semiconductor memory device according to the invention includes at least one first memory cell block, at least one second memory cell block, a first column decoder, a second column decoder, a redundant column and a redundant decoder. The first memory cell block has a first memory cell arrangement. The second memory cell block has a second memory cell arrangement which is different from the first memory cell arrangement. The first column decoder selects any of a plurality of column selection lines in the first memory cell block. The second column decoder selects any of a plurality of column selection lines in the second memory cell block. The redundant column remedies any defective column in the first and second memory cell blocks. The redundant decoder detects the column decoder address of the defective column being designated and substitutes the redundant column for the defective column. The first memory cell block and the second memory cell block share the same column decoder address.

According to another aspect of the invention, a dynamic random access memory includes at least one memory cell block for normal data, at least one memory cell block for parity bits, at least one column decoder of a first type, at least one column decoder of a second type, at least one redundant memory cell block and a redundant column decoder. The memory cell block for normal data has a first memory cell arrangement configured by a plurality of columns and is provided with a plurality of column selection lines provided corresponding to respective columns. The memory cell block for parity bits has a second memory cell arrangement which is different from the first memory cell arrangement and configured by a plurality of columns, and it is provided with a plurality of column selection lines provided corresponding to respective columns. The column decoder of the first type selects any of a plurality of column selection lines of the memory cell block for normal data. The column decoder of the second type selects any of a plurality of column selection lines of the memory cell block for parity bits. The redundant memory cell block includes a redundant column to remedy a defective column in the memory cell block for normal data or in the memory cell block for parity bits. The redundant column decoder detects the column decoder address being designated and substitutes the redundant column substitute for the defective column. Both the column decoder of the first type and the column decoder of the second type share the same column decoder address.

Therefore, major advantage of the invention is that it becomes possible to remedy a defective cell in any memory cell block by only one type of redundant column, as the first and second memory cell blocks which have memory cell arrangements different from each other share the same column decoder address.

Additionally, another advantage of the invention is that is becomes possible to remedy a defective column in an irregular memory cell array arrangement without increasing chip area, since the relation between bit line pairs and column selection lines in each memory cell block is defined such that the first and second memory cell blocks which have memory cell arrangement different from each other share the same column decoder address.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
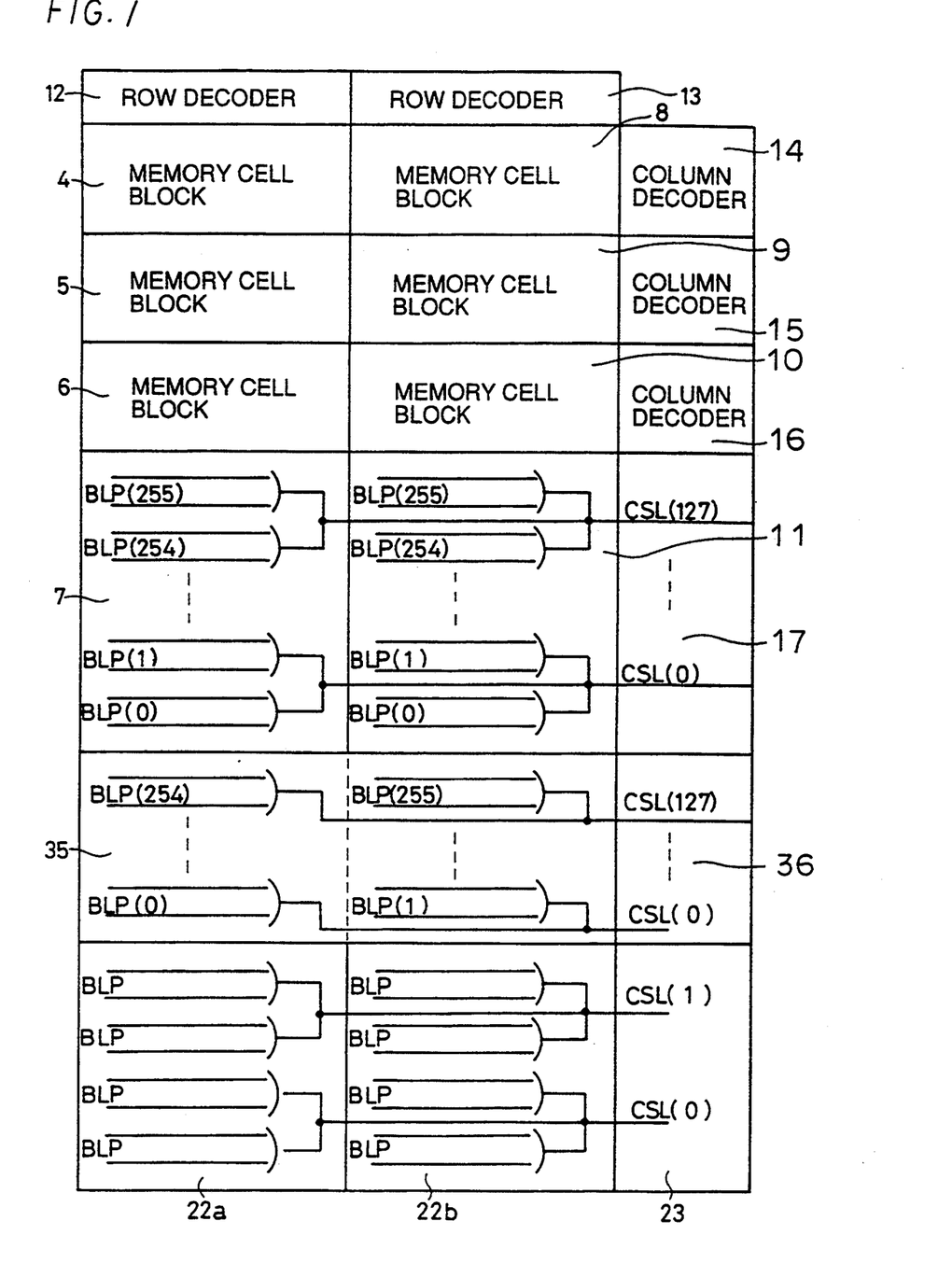
FIG. 1 is a schematic diagram showing a memory cell array arrangement of a DRAM according to one embodiment of the invention.

FIG. 1 is a schematic diagram showing a memory cell array arrangement of a DRAM according to one embodiment of the invention. In FIG. 1, memory cell array blocks 4-11 are the same as conventional memory cell blocks 4-11 shown in FIGS. 4 to 6 and all have an identical structure (memory cell arrangement). For the sake of simplicity, relations between bit line pairs BLP and column selection lines CSL are shown only for memory cell blocks 7 and 11.

In each of such memory cell blocks 7 and 11, two bit line pairs are connected to each of 128 column selection lines CSL, and information of two bit line pairs which are connected to the column selection line activated by the corresponding column decoder 17 is read out to I/O lines which are not shown.

Meanwhile, redundant memory cell blocks 22a and 22b are also the same as conventional memory cell blocks 22a and 22b shown in FIGS. 4 and 6 and in each block, two bit line pairs BLP are connected to each of two column selection lines CSL0 and CSL1. As described for the conventional example above, when a defect occurs in a memory cell included in a normal memory cell block, either of two spare columns of a redundant memory cell block substitutes for an entire column including the defective cell, and the defective memory cell is remedied.

Further, memory cell block 35 in FIG. 1 is an additional memory cell for parity bits shown in FIG. 6 above. In the left side corresponding to row decoder 12, one bit line pair is connected to each of 128 column selection lines CSL, and in the right side corresponding to row decoder 13, one bit line pair is connected to each of 128 column selection lines CSL.

Therefore, in each of the normal memory cell blocks 4-11, when two bit line pairs BLP are arranged to configure one column, while in additional memory cell block 35 one bit line pair BLP is arranged to configure one column as shown in FIG. 1, the number of column selection lines would be 128 in either of the memory cell blocks. As a result, in the structure of FIG. 1, additional memory cell block 35 and other memory cell blocks can be regarded to share the same column decoder address.

As a result, detection of the column including a defective memory cell and substitution thereof in the additional memory cell block 35 for parity bits can be carried out by one type of redundant column (redundant memory cell blocks 22a and 22b and redundant column decoder 23) in the same manner as in other normal memory cell blocks.

Figure 2:
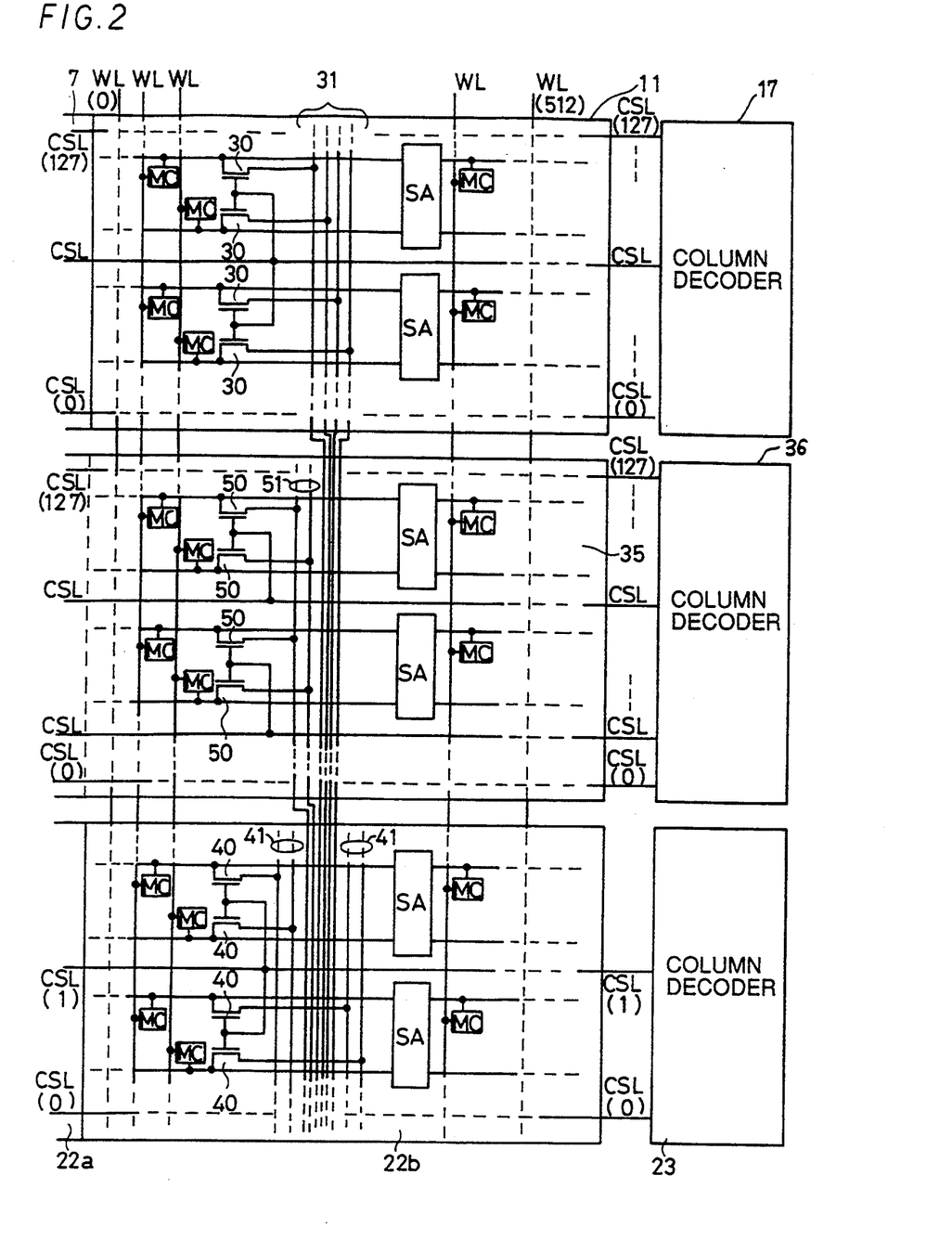
FIG. 2 is a circuit diagram showing in detail a main portion of the DRAM shown in FIG. 1.

FIG. 2 is a circuit diagram showing in detail a main portion of the DRAM shown in FIG. 1. FIG. 2 shows two bit line pairs connected to one column selection line CSL which extends from column decoder 17 among 256 bit line pairs configuring a memory cell block 11 of FIG. 1 and elements associated therewith, two bit line pairs connected to two column selection lines CSL which extend from column decoder 36 among 128 bit line pairs configuring the right half of additional memory cell block 35 for parity bits in FIG. 1 and elements associated therewith, and two bit line pairs connected to one column selection line CSL1 which extends from redundant column decoder 23 among four bit line pairs configuring redundant memory cell block 22b in FIG. 1 and elements associated therewith.

As shown in FIG. 2, two bit line pairs are connected to one column selection line CSL in normal memory cell block 11 and redundant memory cell block 22b, while one bit line pair is connected to one column selection line CSL in additional memory cell block 35. In memory cell block 11, when one column selection line CSL is selected by the corresponding column decoder 17 in reading/writing data, I/O gate transistors 30 of two bit line pairs connected to the column selection line is turned on and two bit line pairs are connected to I/O lines 31. I/O lines 31 are connected with input/output buffer 21 (FIG. which is not shown).

Meanwhile, in additional memory cell block 35, when one column selection line CSL is selected by column decoder 36 in reading/writing parity bits, I/O gate transistors 50 of one bit line pair connected to the column selection line are turned on and one bit line pair is connected to I/O lines 51. I/O lines 51 are connected with an I/O input/output buffer 21 (FIG. 4) through an I/O switch 19 which is not shown.

In contrast, in redundant memory cell block 22b, when either a column of the normal memory cell block or the additional memory cell block is detected defective and the address of the column is designated, a bit line pair connected to either one of column selection lines CSL0 and CSL1 is selected and operates in place of the defective column. As described in relation to FIG. 1, since the connective relation between column selection lines and bit line pairs in each memory cell block is set so that the normal memory cell block and the additional cell block share the same column decoder address, it is possible to replace the aforementioned defective column by one type of the redundant column and the increase of chip area can be prevented.

Figure 3:
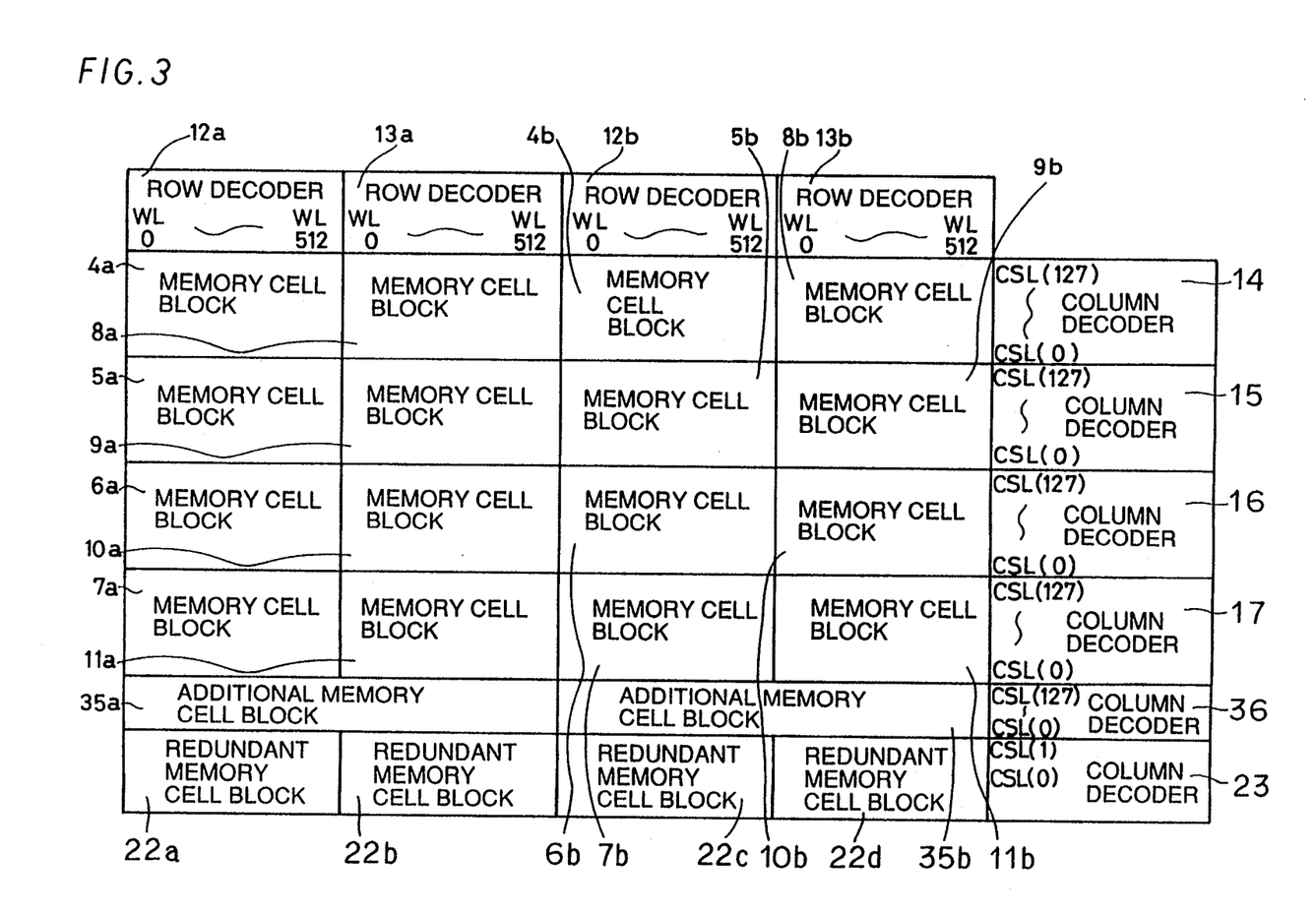
FIG. 3 is a schematic diagram showing a memory cell array arrangement of a DRAM according to another embodiment of the invention.

This invention is not limited to a memory cell array arrangement shown in FIG. 1. FIG. 3 is a schematic diagram showing a memory cell array arrangement of a DRAM according to another embodiment of the invention and it includes two arrangements of the embodiment of FIG. 1 coupled laterally. Each of the components such as the normal memory cell block, the additional memory cell block and the redundant memory cell block in the example of FIG. 3 is the same as each component of the embodiment shown in FIGS. 1 and 2, and even in a DRAM of such larger scale memory cell array arrangement, only one type of redundant column can remedy a defective column without increasing chip area in the same manner.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   at least one first memory cell block having a plurality of column selection lines with a first number of bit lines connected to each column selection line;
   at least one second memory cell block having a plurality of column selection lines with a second number of bit lines, different from said first number of bit lines, connected to each column selection line;
   a first column decoder for selecting any of said plurality of column selection lines of said first memory cell block;
   a second column decoder for selecting any of said plurality of column selection lines of said second memory cell block;
   a redundant column for remedying any defective column of said first and second memory cell blocks; and
   means for detecting designation of a column decoder address of said defective column and substituting said redundant column for the defective column;
   wherein said first memory cell block and said second memory cell block share the same column decoder address.

2. A semiconductor memory device according to claim 1, wherein the relation between column selection lines and bit line pairs in each memory cell block is defined such that said first memory cell block and said second memory cell block share the same column decoder address.

3. A dynamic random access memory, comprising:
   at least one memory cell block for normal data having a first memory cell arrangement constituted by a plurality of rows and a plurality of columns, each column having a first plurality of bit line pairs, and including a plurality of column selection lines each provided corresponding to respective ones of said plurality of columns;
   at least one memory cell block for parity bits having a second memory cell arrangement constituted by a plurality of rows and columns, each column having a second plurality of bit line pairs, different from said first plurality of bit line pairs, and including a plurality of column selection lines each provided corresponding to respective ones of said plurality of columns;
   at least one column decoder of a first type for selecting any of said plurality of column selection lines of said at least one memory cell block for normal data;
   at least one column decoder of a second type for selecting any of said plurality of column selection lines of said at least one memory cell block for parity bits;
   at least one redundant memory cell block including a redundant column for remedying a defective column in said at least one memory cell bock for normal data or said at least one memory cell block for parity bits; and
   a redundant column decoder for detecting designation of a column address decoder of said defective column and substituting said redundant column for said defective column;
   wherein said column decoder of the first type and said column decoder of the second type share the same column decoder address.

4. A dynamic random access memory according to claim 3, wherein
   the connective relation between the bit line pairs and the column selection lines is defined in each memory cell block such that the number of said columns of aid memory cell block for normal data and the number of said columns of said memory cell bock for parity bits are equal to each other.

5. A dynamic random access memory according to claim 4, wherein
   said plurality of column selection lines and said column decoder of the first type are provided commonly to the plurality of said memory cell blocks for normal data arranged in the column direction,
   one said memory cell block for parity bits and said column decoder of the second type are provided corresponding to said plurality of memory cell blocks for normal data,
   said one memory cell block for parity bits has a plurality of said bits line pairs for each small block formed by dividing said memory cell block for parity bits corresponding to said plurality of memory cell block for normal data, and the connective relation between the bit line pairs and the column selection lines in each memory cell block is defined based on the relation between the number of bit line pairs in said each memory cell block for normal data and the number of bit line pairs per small block of said memory cell block for parity bits.

* * * * *